(12) United States Patent
Loftin et al.

(10) Patent No.: US 6,844,271 B2
(45) Date of Patent: Jan. 18, 2005

(54) PROCESS OF CVD OF HF AND ZR CONTAINING OXYNITRIDE FILMS

(75) Inventors: John D. Loftin, Escondido, CA (US); Robert D. Clark, San Marcos, CA (US); Arthur Kenneth Hochberg, Solana Beach, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 16 days.

(21) Appl. No.: 10/444,217

(22) Filed: May 23, 2003

(65) Prior Publication Data

US 2004/0235312 A1 Nov. 25, 2004

(51) Int. Cl.$^7$ ............................................... H01L 21/31
(52) U.S. Cl. ...................... 438/785; 438/786; 438/591; 438/287
(58) Field of Search ................. 438/785, 786, 438/591, 240, 287

(56) References Cited

U.S. PATENT DOCUMENTS

| | | | | |
|---|---|---|---|---|
| 6,013,553 | A | 1/2000 | Wallace et al. | 438/287 |
| 6,020,243 | A | 2/2000 | Wallace | 438/287 |
| 6,238,734 | B1 | 5/2001 | Senzaki et al. | 427/226 |
| 6,291,867 | B1 | 9/2001 | Wallace | 257/410 |
| 6,486,080 | B2 | 11/2002 | Chooi et al. | 438/785 |
| 6,503,561 | B1 | 1/2003 | Senzaki et al. | 427/226 |
| 6,613,658 | B2 * | 9/2003 | Koyama et al. | 438/591 |
| 2003/0072975 | A1 | 4/2003 | Shero et al. | |
| 2004/0002183 | A1 | 1/2004 | Colombo et al. | |
| 2004/0009678 | A1 * | 1/2004 | Asai et al. | 438/785 |
| 2004/0025787 | A1 * | 2/2004 | Selbrede et al. | 118/715 |
| 2004/0121544 | A1 * | 6/2004 | Chang | 438/264 |
| 2004/0144980 | A1 * | 7/2004 | Ahn et al. | 257/69 |

OTHER PUBLICATIONS

"Thermally Stable CVD HfO$_x$N$_y$ Advanced . . . ", 2002 IEEE O–7803–7463–X/02 (C), 4 pages.
M. Lee, et al, Interfacial Growth in HfOxNy Gate Dielectric Deposited Using . . . , App. Phy. Letters AIP USA, vol. 83, No. 13, 2003, pp. 2638–2640.
C.H. Choi, et al, Electrical Properties and Thermal Stability of CVD . . . , IEEE Elec. Dev. Letters, IEEE Inc., NY, vol. 24, No. 4, 2003, pp. 215–217.

* cited by examiner

Primary Examiner—Michael Trinh
(74) Attorney, Agent, or Firm—Geoffrey L. Chase

(57) ABSTRACT

This invention relates to a chemical vapor deposition process for forming Zr or Hf oxynitride films suitable for use in electronic applications such as gate dielectrics. The process comprises: a. delivering a Zr or Hf containing precursor in gaseous form to a chemical vapor deposition chamber, and, b. simultaneously delivering an oxygen source and a nitrogen source to the chamber separately, such that mixing of these sources with the precursor does not take place prior to delivery to the chamber, and, c. contacting the resultant reaction mixture with a substrate in said chamber, said substrate heated to an elevated temperature to effect deposition of the Zr or Hf oxynitride film, respectively. A silicon containing precursor may be added simultaneously to the chamber for forming Zr or Hf silicon oxynitride films.

20 Claims, 1 Drawing Sheet

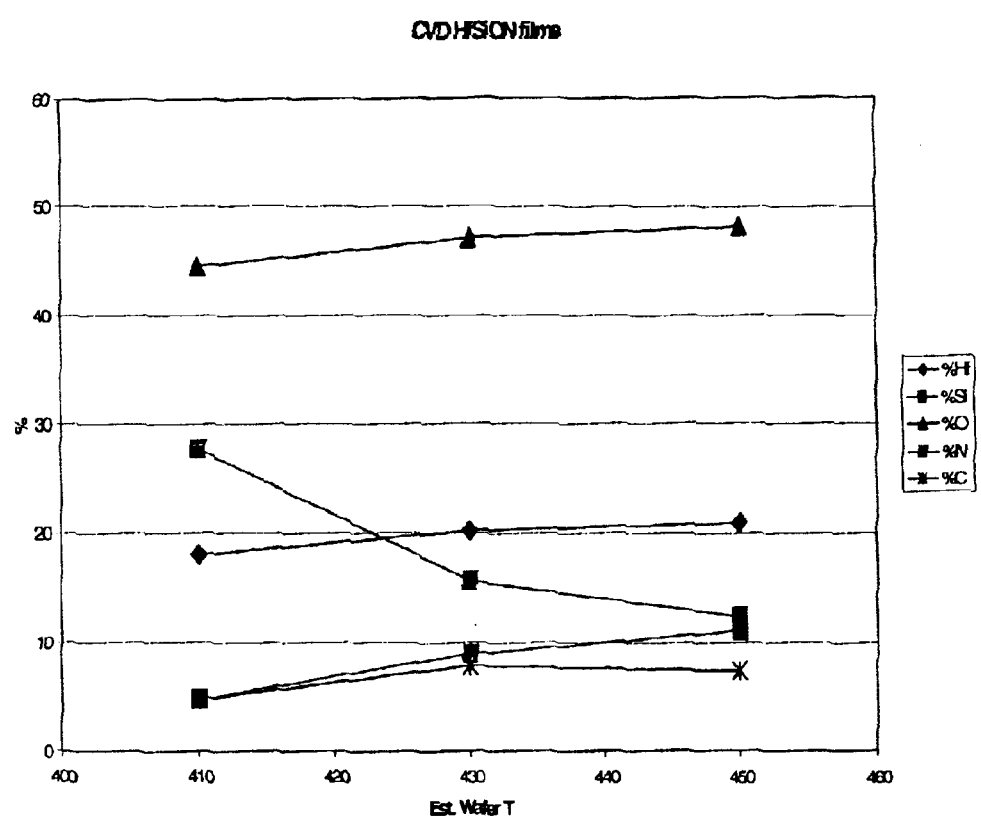

PROCESS OF CVD OF HF AND ZR CONTAINING OXYNITRIDE FILMS

BACKGROUND OF THE INVENTION

The semiconductor fabrication industry requires materials and deposition technology adequate to deposit metals, metal mixtures and metal compound mixtures in thin layers, plugs, vias, and patterns on semiconductor and insulating or dielectric substrates to make appropriate electrical devices for integrated circuits, memory devices and flat panel display devices.

Various techniques are known for depositing metals, metal compounds and their mixtures on appropriate electronic materials substrates, including; physical methods sputtering, molecular beam epitaxy, evaporation and laser ablation, alloying, and chemical vapor deposition (plasma, photo or laser enhanced).

Chemical vapor deposition (CVD) has gained favor in recent years due to its properties of providing uniform and conformal deposition and its ability to deposit an array of materials under highly controllable conditions. Typically, chemical vapor deposition can provide high deposition rates of high purity materials in a controlled fashion.

Zirconium and hafnium oxynitride gate dielectrics and zirconium and hafnium silicon oxynitride gate dielectrics have been generated by multiple processes, e.g., sputter deposition, plasma deposition, and electron-beam. These gates afford higher dielectric constants than conventional thermal silicon oxide or silicon dielectric layers and they may be thicker.

Representative articles in the prior art illustrating the formation of zirconium and hafnium metal films, zirconium and hafnium oxynitride and zirconium and hafnium-silicon oxynitride dielectrics are as follows:

U.S. Pat. No. 6,503,561 discloses a thermal CVD process for the deposition of multiple metal layers on a substrate from a solventless mixture of two or more metal ligand complex precursors, e.g., zirconium, hafnium, aluminum, germanium, etc. where the ligand is selected from the alkyls, imides, amides, halides, nitrates, fluorine, by direct liquid injection to a flash vaporization zone and the solventless mixture is mixed with oxygen prior to deposition of the multiple metal compound layer.

U.S. Pat. No. 6,291,867 discloses the formation of hafnium and zirconium silicon-oxynitride gate dielectrics by plasma deposition. One process includes the plasma deposition of a zirconium silicide on a substrate, annealing in an atmosphere including oxygen and nitrogen, e.g., NO. In another method, the silicon silicide layer is annealed in a non-oxidizing atmosphere including $NH_3$ or nitrogen and then annealed in an oxidizing atmosphere. A CVD process is disclosed for forming the silicide layers.

The article, *Thermally Stable CVD HfOxNy Advanced Gate Dielectrics With Poly-Si Gate Electrode*, 2002 IEEE 0-7803-7463-X/02/$17.00 (C) discloses the formation of HfOxNy layers wherein a tetrakisdiethylamino hafnium precursor with $N_2$ carrier gas and ammonia is deposited by rapid thermal CVD followed by post deposition annealing at 800 to 900° C. In the process, the HfOxNy is grown at a temperature of from 700 to 800° C.

In a comparison example, $HfO_2$ was deposited at 500° C. using $O_2$ and the same precursor followed by post deposition annealing.

BRIEF SUMMARY OF THE INVENTION

This invention relates to an improvement in a process for forming Zr and Hf oxynitride films (ZrOxNy and HfOxNy) and Zr and Hf silicon oxynitride films (Zr(Si)zOxNy and Hf(Si)zOxNy) suitable for use in electronic applications such as dielectric gates. The variable (x), the variable (y) and the variable z are positive numbers greater than 0. The improvement in the process comprises:

(a) forming a reaction mixture in a chemical vapor deposition chamber by introducing a Zr or Hf containing precursor, an oxygen source and a nitrogen source to said chemical vapor deposition chamber without mixing of the Zr or Hf containing precursor with the oxygen source and the nitrogen source prior to introduction to the chemical vapor deposition chamber; and, (b) contacting a substrate with the reaction mixture at elevated temperature, e.g., a temperature between 300 and 700° C. in the chamber whereby a Zr and Hf oxynitride film is deposited.

Several advantages can be achieved by the process described, they include:

an ability to generate quality Zr/Hf oxynitride films and Zr/Hf—Si-oxynitride films;

an ability to incorporate significant nitrogen content into the oxynitride films;

an ability to use a chemical vapor deposition process to effect deposition, an ability to use a low temperature process and maintain a low wafer (substrate) temperature when depositing Zr/Hf oxynitride films and Zr/Hf—Si-oxynitride films; and, an ability to produce quality films in a single process step.

BRIEF DESCRIPTION OF THE INVENTION

The drawing is a graph of hafnium silicon oxynitride films at various temperatures in percent versus temperature.

DETAILED DESCRIPTION OF THE INVENTION

This invention relates to an improvement in processes for depositing Zr/Hf oxynitride films and Zr/Hf Si-oxynitride films on a substrate such as a silicon wafer for use in semiconductor devices. In the process for depositing Zr/Hf oxynitride films, a reaction mixture is formed in the chemical vapor deposition chamber comprised of a zirconium or hafnium precursor, a nitrogen source and an oxygen source and, in preparing Zr/Hf Si-oxynitride films, a silicon precursor is added to the reaction mixture.

A wide variety of zirconium and hafnium precursors containing at least one ligand can be used in implementing the process. These include zirconium and hafnium chlorides, zirconium and hafnium amides. Other ligands for zirconium and hafnium precursors include the $C_{1-4}$ Alkyls and alkoxides; siloxides, halides, hydrides, imides, azides, nitrates, cyclopentadienyls, and carbonyls. Preferably, the precursor is liquid at ambient conditions.

Specific halide examples include zirconium and hafnium tetrachloride, and specific amides include those selected from the group consisting of dimethyl amido $Zr(N(CH_3)_2)_4$, or $Hf(N(CH_3)_2)_4$, diethyl amido $Zr(N(CH_2CH_3)_2)_4$ or $Hf(N(CH_2CH_3)_2)_4$, ethylmethyl amido $Zr[N(CH_2CH_3)(CH_3)]_4$, or $Hf[N(CH_2CH_3)(CH_3)]_4$, or, butyl amido, dipropyl amido, methylpropyl amido, ethylpropyl amido. Specific alkoxides are selected from the group methoxy, ethoxy, propoxy, and butoxy $Zr(OC_4H_9)_4$ or $Hf(OC_4H_9)_4$.

A wide variety of Si precursors can be used when Zr—Si and Hf—Si oxynitride films are desired. Preferably, the ligand of the Si precursor is the same as or similar to that employed for the zirconium and hafnium precursor to produce Zr/Hf Si oxynitride films. One type of silicon amide is of the form $(H)_xSi(NR^1R^2)_{4-x}$ where $R^1$ and $R^2$ are $C_{1-8}$ alkyls and x is the integer 0, 1, 2 or 3. A specific form of silicon amide is selected from the group consisting of $Si[N(CH_2CH_3)_2]_4$, $Si[N(CH_2CH_3)(CH_3)]_4$, $Si[N(CH_3)_2]_4$, $HSi[N(CH_2CH_3)_2]_3$, $HSi[N(CH_2CH_3)(CH_3)_2]_3$, $HSi[N(CH_3)_2]_3$ or $H_2Si[NH(C_4H_9)]_2$. The level of silicon precursor employed in forming the Zr—Si and Hf—Si oxynitride films is at the discretion of the film designer, i.e., z is positive when Zr—Si and Hf—Si oxynitride films are produced.

In the CVD process described herein, the preferred ligand form is the amide. It affords the ability to effect deposition of zirconium and hafnium oxynitride films and zirconium or hafnium silicon oxynitride films on a substrate such as a silicon wafer at low substrate temperatures, e.g., 400 to 500° C., typically at or below 10 Torr.

Conventional oxygen and nitrogen sources may be used in the formation of the Zr/Hf oxynitride films and Zr/Hf—Si-oxynitride films. Oxygen sources include oxygen, water, $NO_2$, NO, $N_2O$, ozone and air while nitrogen sources include the amide, ammonia, NO, air, $N_2O$, $NO_2$, $N_2H_2$ and so forth. For ease of operation and control, oxygen and ammonia are preferred as the oxygen and nitrogen sources respectively. The nitrogen/oxygen source, NO, typically requires higher processing temperatures.

A key to the successful deposition of quality Zr/Hf oxynitride films and Zr/Hf—Si-oxynitride films on a substrate such as a silicon wafer by chemical vapor deposition is the delivery of the precursor separately to the chemical vapor deposition reaction chamber from the oxygen source and nitrogen source, i.e., without prior mixing. The use of separate delivery lines enables one to eliminate mixing of the precursors with the protic nitrogen sources and with the the oxygen sources prior to entering the reaction chamber. It has been found that prior mixing of the precursor with either of the oxygen or nitrogen sources, although common in CVD processes, leads to reaction prior to reaching the chamber. When this happens, the deposition is ineffective and difficult to control.

One advantage achieved by the practice herein is that it is possible to consistently achieve high levels of nitrogen in the oxynitride film. On an atomic basis, nitrogen levels, i.e., the value (y) in the formula ZrOxNy or HfOxNy is from a low of 1% to generally 5% and above. Typically, y can range from 10 to 30%. The value x in the films range from 40 to 50, although other values can be generated by control of the oxygen level in the reaction mixture.

The following examples are intended to illustrate various embodiments of the invention.

EXAMPLE 1

Deposition of Films Containing Hf, Si, Oxygen and Nitrogen Using $Hf[N(CH_2CH_3)_2]_4$, $Si[N(CH_3)_2]_4$, $O_2$, and $NH_3$ A liquid precursor mixture comprised of a 1:2 weight ratio of $Hf[N(CH_2CH_3)_2]_4$ and $Si[N(CH_3)_2]_4$ respectively was transported via liquid delivery to a heated vaporizer and delivered to a CVD reaction chamber using a 200 sccm flow of He sweep gas through an injector ring located above the substrate which can be raised or lowered. An oxidant mix comprised of up to 15 sccm $O_2$, up to 15 sccm of $NH_3$ and up to 300 sccm He dilute gas was delivered separately to the chamber, and the entry point of the oxidant mixture was separated from the precursor injector ring by a diffusion plate which could be raised or lowered. The precursor and oxidants were reacted at a heated substrate (300–700° C.) to produce films containing Hf, Si, O, and N as determined by RBS. The chamber pressure was held at 1 Torr using a pressure control valve. Using flows of 5 to 10 sccm $O_2$ and 1.85 sccm $NH_3$ and 0.1 mL/min precursor, the film compositions as represented in the graph of the drawing were realized at the indicated estimated wafer temperatures, i.e., 410, 430 and 450° C.

The results in the graph in the drawing show films having nitrogen levels of greater than 10 atomic % up to about 28 atomic % nitrogen. The graph also shows that it is possible to maintain a low wafer temperature, e.g., from 410 to 450° C. in the CVD chamber.

EXAMPLE 2

Deposition of Films Containing Hf, Si, Oxygen and Nitrogen Using $Hf[N(CH_3)_2]_4$, $Si[N(CH_3)_2]_4$, $O_2$, and $NH_3$ A liquid precursor mixture comprised of a 5:7 weight ratio of $Hf[N(CH_2CH_3)_2]_4$ and $Si[N(CH_3)_2]_4$ respectively was transported via liquid delivery to a heated vaporizer and delivered to a CVD reaction chamber using a 200 sccm flow of He sweep gas through an injector ring located above the substrate which can be raised or lowered. An oxidant mix comprised of up to 30 sccm $O_2$, up to 5 sccm of $NH_3$ and up to 200 sccm He dilute gas was delivered separately to the chamber, and the entry point of the oxidant mixture was separated from the precursor injector ring by a diffusion plate which could be raised or lowered. The precursor and oxidants were reacted at a heated substrate (300–7000° C.) to produce films containing Hf, Si, O, and N as determined by RBS. The chamber pressure was held at 1 to 1.5 Torr using a pressure control valve. Using flows of 15 to 30 sccm $O_2$, 1.85 to 5 sccm $NH_3$ and 0.1 to 0.2 mL/min precursor at substrate temperatures estimated to be between 400 and 500° C. reasonable deposition rates and film quality were obtained.

EXAMPLE 3

Deposition of Films Containing Hf, Oxygen and Nitrogen Using $Hf[N(CH_2CH_3)_2]_4$, $O_2$, and $NH_3$ The procedure of Example 1 is followed except that $Hf[N(CH_2CH_3)_2]_4$ was transported via liquid delivery to a heated vaporizer and delivered to a CVD reaction chamber using a 200 sccm flow of He sweep gas through an injector ring located above the substrate which can be raised or lowered. Deposition occurs and a hafnium oxynitride film is produced.

COMPARATIVE EXAMPLE 4

The procedure of Example 1 is followed except in accordance with the procedure of a typical CVD process wherein the precursor stream and oxidant stream containing ammonia is delivered together through a showerhead.

When this configuration is tried typically there is either no deposition or there is either no or insignificant nitrogen incorporation in the film. Although not intending to be bound one can speculate that this result is due to a difficulty in reacting the nitrogen source.

EXAMPLE 5

The procedure of Example 3 is repeated except that a specialized showerhead is used in which there is separation of the ammonia and the precursor, i.e., the precursor and ammonia containing streams are delivered through alternating holes in the showerhead. Film deposition occurs as in Examples 1–3.

EXAMPLE 6

The procedure of Example 1 is followed except the hafnium precursor is hafnium chloride. Although these precursors are acceptable, their use is not without problems. These precursors are solids under conventional conditions and therefore present difficulties in delivery to the chemical vapor deposition chamber. In addition, use of these precursors with ammonia can result in the formation of ammonium chloride particles in the chamber which are detrimental to integrated circuit production.

What is claimed is:

1. In a deposition process for forming a metal oxynitride film selected from the group consisting of Zr and Hf oxynitride film, the process which comprises:

A. forming a reaction mixture in a chemical vapor deposition chamber by
      (a) delivering a precursor selected from the group consisting of a Zr and Hf containing precursor in gaseous form to said chemical vapor deposition chamber; and,
      (b) delivering an oxygen source and a nitrogen source to the chamber separately, such that mixing of said oxygen source and said nitrogen source with the precursor does not take place prior to delivery to the chemical vapor deposition chamber; and,
   B. contacting the resultant reaction mixture with a substrate in said chemical vapor deposition chamber, said substrate heated to an elevated temperature to effect deposition of the metal oxynitride film.

2. The process of claim 1 wherein the metal precursor is delivered in gaseous form to said chemical vapor deposition chamber at or below about 10 Torr in pressure.

3. The process of claim 1 wherein the substrate is heated at a temperature from 300 to 700° C.

4. The process of claim 1 wherein the metal precursor is a Zr or Hf amide.

5. The process of claim 4 wherein the Zr or Hf amide is selected from the group consisting of $Zr[N(CH_2CH_3)_2]_4$, $Zr[N(CH_2CH_3)(CH_3)]_4$, $Zr[N(CH_3)_2]_4$, $Hf[N(CH_2CH_3)_2]_4$, $Hf[N(CH_2CH_3)(CH_3)]_4$, or $Hf[N(CH_3)_2]_4$.

6. The process of claim 5 wherein the oxygen and nitrogen source is NO, $N_2O$ or $NO_2$.

7. The process of claim 4 wherein the oxygen source is $O_2$, $H_2O$, $O_3$, or $H_2O_2$.

8. The process of claim 7 wherein the nitrogen source is $NH_3$ or, $N_2H_4$.

9. The process of claim 5 wherein the oxygen source is $O_2$ and the nitrogen source is $NH_3$.

10. The process of claim 5 wherein a silicon precursor is added to the chemical vapor deposition chamber for forming a Zr or Hf silicon oxynitride film.

11. The process of claim 10 wherein the silicon precursor is a silicon amide.

12. The process of claim 11 wherein the silicon amide is of the form $(H)_xSi(NR^1R^2)_{4-x}$ where $R^1$ and $R^2$ are $C_{1-8}$ alkyls and x is the integer 0, 1, 2 or 3.

13. The process of claim 12 wherein the silicon amide is selected from the group consisting of $Si[N(CH_2CH_3)_2]_4$, $Si[N(CH_2CH_3)(CH_3)]_4$, $Si[N(CH_3)_2]_4$, $HSi[N(CH_2CH_3)_2]_3$, $HSi[N(CH_2CH_3)(CH_3)]_3$, $HSi[N(CH_3)_2]_3$ or $H_2Si[NH(C_4H_9)]_2$.

14. In a process for forming a metal oxynitride film selected from the group consisting of Zr oxynitride film and Hf oxynitride film on a substrate, the process which comprises:

a. delivering a precursor selected from the group consisting of Zr and Hf amide precursors in gaseous form to a chemical vapor deposition chamber; and,
   b. delivering oxygen and ammonia to the chemical vapor deposition chamber separately from the precursor; and,
   c. contacting a substrate with the resultant reaction mixture formed by the delivery of said precursor, said oxygen and said ammonia within said chemical vapor deposition chamber, said substrate heated to a temperature between 300 and 700° C. thereby depositing the metal oxynitride film.

15. The process of claim 14 wherein the Zr or Hf precursor is selected from the group consisting of $Zr(N(CH_2CH_3)_2]_4$, $Zr[N(CH_2CH_3)(CH_3)]_4$, $Zr[N(CH_3)_2]_4$, $Hf[N(CH_2CH_3)_2]_4$, $Hf[N(CH_2CH_3)(CH_3)]_4$, and $Hf[N(CH_3)_2]_4$.

16. In a deposition process for forming a metal oxynitride film selected from the group consisting of Zr silicon oxynitride film and Hf silicon oxynitride film, the process which comprises:

(a) delivering a precursor selected from the group consisting of Zr containing precursor and Hf containing precursor in gaseous form to a chemical vapor deposition chamber;
   (b) delivering a Si containing precursor in gaseous form to the chamber either separately or as a mixture with said Zr or Hf containing precursor;
   (c) delivering an oxygen source and a nitrogen source to the chamber separately from the Zr, Hf and Si containing precursors; and,
   (d) contacting a substrate with the resultant reaction mixture while in said chamber, said substrate heated to a temperature between 300 and 700° C. and the Zr silicon oxynitride film or Hf silicon oxynitride film being deposited on said substrate.

17. The process of claim 16 wherein the Zr or Hf and silicon containing precursor is delivered in gaseous form to a chemical vapor deposition chamber at or below 10 Torr.

18. The process of claim 17 wherein the Zr or Hf and Si containing precursors are Zr amides or Hf amides and silicon amides.

19. The process of claim 18 wherein the amide is selected from the group consisting of $N(CH_2CH_3)_2$, $N(CH_2CH_3)(CH_3)$, $N(CH_3)_2$, and $N(CH_2CH_3)_2$.

20. The process of claim 19 wherein the oxygen source is $O_2$ and the nitrogen source is $NH_3$.

* * * * *